US012656425B2

(12) United States Patent
Kessler

(10) Patent No.: US 12,656,425 B2
(45) Date of Patent: Jun. 16, 2026

(54) INSULATOR AND/OR CONSTRUCTION MATERIAL FOR NMR APPLICATIONS

(71) Applicant: Quad Systems AG, Dietlikon (CH)

(72) Inventor: Klemens Kessler, Oberneunforn (CH)

(73) Assignee: Quad Systems AG, Dietlikon (CH)

( * ) Notice: Subject to any disclaimer, the term of this patent is extended or adjusted under 35 U.S.C. 154(b) by 243 days.

(21) Appl. No.: 18/276,766

(22) PCT Filed: Jan. 26, 2022

(86) PCT No.: PCT/EP2022/051785
§ 371 (c)(1),
(2) Date: Aug. 10, 2023

(87) PCT Pub. No.: WO2022/171440
PCT Pub. Date: Aug. 18, 2022

(65) Prior Publication Data
US 2024/0319296 A1     Sep. 26, 2024

(30) Foreign Application Priority Data

Feb. 11, 2021     (EP) ..................................... 21156626

(51) Int. Cl.
*G01R 33/30*          (2006.01)
*G01N 24/08*          (2006.01)
(52) U.S. Cl.
CPC ............. *G01R 33/30* (2013.01); *G01N 24/08* (2013.01)
(58) Field of Classification Search
None
See application file for complete search history.

(56) References Cited

U.S. PATENT DOCUMENTS 3,091,732 A     5/1963   Anderson et al.
4,549,136 A     10/1985  Zens
(Continued)

FOREIGN PATENT DOCUMENTS

CN     102580146 A   *   7/2012   ................ A61P 7/02
JP     H0784023 A    *   3/1995   ............. G01R 33/30
(Continued)

OTHER PUBLICATIONS

Laizhou Song, et al., "Tribological properties of *a*-, and β-manganese dioxide/polytetrafluoroethylene composites under the dry sliding condition", Tribology International, XP029333720, 2016, pp. 187-197, vol. 94.
(Continued)

*Primary Examiner* — Rodney E Fuller
(74) *Attorney, Agent, or Firm* — Sughrue Mion, PLLC

(57)     ABSTRACT

A compound having (A) 40-99.99 weight percent of at least one thermoplastic or thermoset polymer material selected as a halogenated or perhalogenated polymer; (B) 0.01-60 weight percent of at least one inorganic particulate diamagnetic or paramagnetic material; and (C) 0-39.99 weight percent of at least one additive different from (B). The compound is proposed as a construction material in the detection-relevant spatial area of a nuclear magnetic resonance device with a static magnetic field of at least 1 Tesla, and furthermore corresponding constructional elements, in particular sample holders, are proposed as well as method of manufacturing such constructional elements and uses of such constructional elements.

27 Claims, 2 Drawing Sheets

(56)     References Cited

U.S. PATENT DOCUMENTS

| | | | |
|---|---|---|---|
| 5,831,434 A | 11/1998 | Shigezane et al. | |
| 6,054,857 A * | 4/2000 | Doty .................... | G01R 33/307 |
| | | | 324/321 |
| 10,209,324 B2 * | 2/2019 | Fordham .............. | G01N 24/081 |
| 2005/0024055 A1 * | 2/2005 | Cavaluzzi .............. | G01R 33/30 |
| | | | 324/321 |
| 2008/0106263 A1 | 5/2008 | Fey et al. | |
| 2009/0160439 A1 | 6/2009 | Fishbein | |
| 2009/0295389 A1 | 12/2009 | Pruessmann et al. | |
| 2020/0355770 A1 * | 11/2020 | Williams ............... | G01R 33/46 |

FOREIGN PATENT DOCUMENTS

| | | | | |
|---|---|---|---|---|
| WO | WO-2009045354 A1 * | 4/2009 | ............ | G01R 33/50 |
| WO | 2014/138136 A1 | 9/2014 | | |

OTHER PUBLICATIONS

International Search Report for PCT/EP2022/051785 dated May 2, 2022 (PCT/ISA/210).
Written Opinion for PCT/EP2022/051785 dated May 2, 2022 (PCT/ISA/237).

* cited by examiner

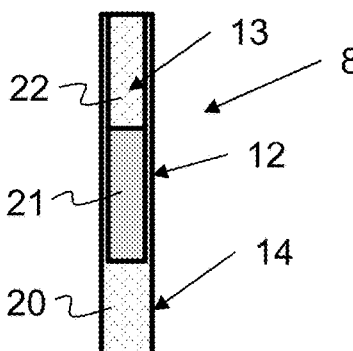
FIG. 3
FIG. 4a)
FIG. 4b)
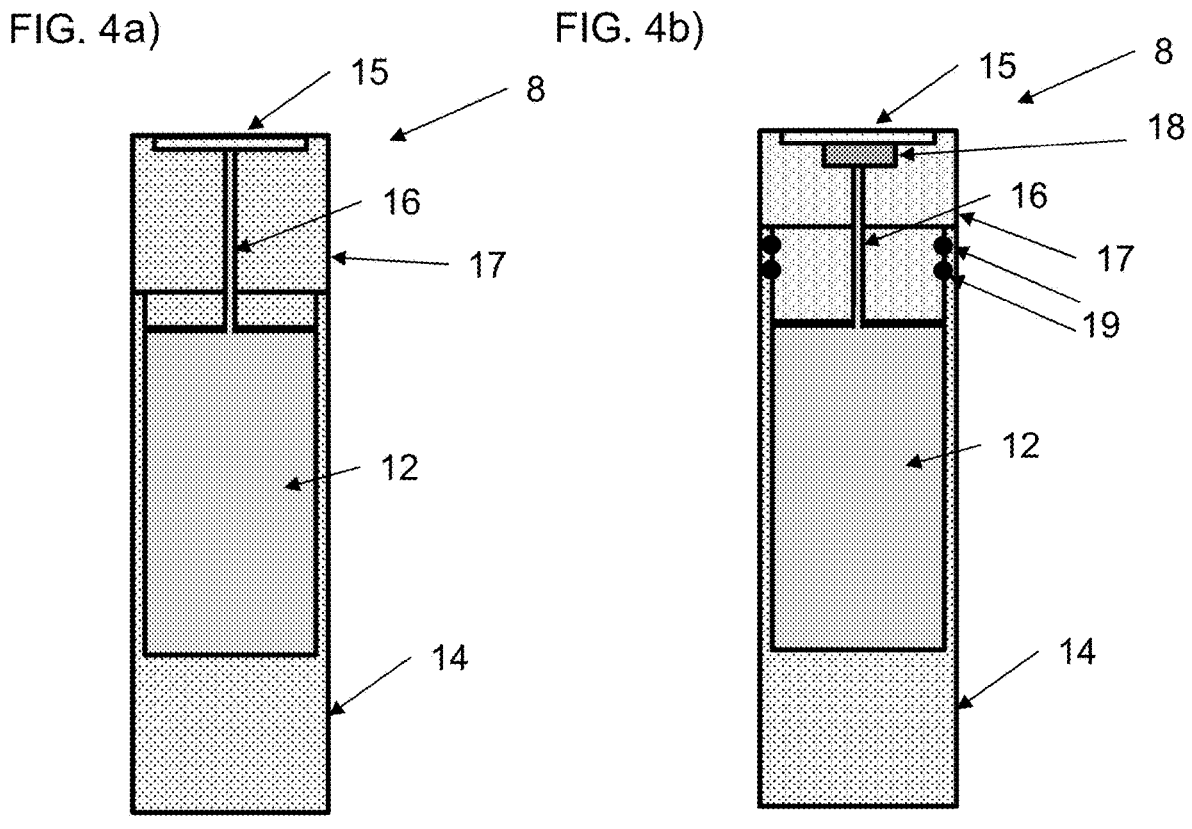

INSULATOR AND/OR CONSTRUCTION MATERIAL FOR NMR APPLICATIONS

CROSS REFERENCE TO RELATED APPLICATIONS

This application is a National Stage of International Application No. PCT/EP2022/051785 filed Jan. 26, 2022, claiming priority based on European Patent Application No. 21 156 626.0 filed Feb. 11, 2021.

TECHNICAL FIELD

The present invention relates to the use of specific compounds as insulator and/or construction material for NMR applications with magnetic susceptibility matching. It furthermore relates to devices and elements for NMR applications based on such compounds as well as methods for producing such devices and uses of such devices and to the compounds as such suitable and adapted for these uses.

PRIOR ART

For achieving a high signal-to-noise ratio and thus a high-sensitivity and selectivity/resolution the homogeneity of the magnetic field in the sample and irradiation/detection area is of utmost importance in high magnetic field nuclear magnetic resonance (NMR) measurements. To achieve this goal, care has to be taken that not only the general surrounding of the magnet but in particular the critical volume around the irradiation/detection coils and around these irradiation/detection coils as well as in the area of corresponding samples inserted into the coils as little as possible disturb the homogeneity of the magnetic field in that area.

Partly homogeneity caused by these elements can be compensated by corresponding compensation elements, so-called shims. There are two types of shimming: active and passive. Active shimming uses coils with adjustable current. Passive shimming involves pieces of steel with good magnetic qualities. The steel pieces are placed near the permanent or superconducting magnet. They become magnetized and produce their own magnetic field. In both cases, the additional magnetic fields (produced by coils or steel) add to the overall magnetic field of the superconducting magnet in such a way as to increase the homogeneity of the total field.

U.S. Pat. No. 4,549,136 desires to promote magnetic homogeneity of materials, including structural elements, present in the sensitive volume of a gyromagnetic analysis apparatus. Where the sample is rotated along an axis transverse to the field the requirement reduces to establishing axial homogeneity. Plugs which match the solvent magnetic susceptibility are employed to constrain a sample within the central region of an RF probe coil thereby appearing relatively invisible in the magnetic sense to the instrument. The susceptibility of materials can be tailored to achieve a desired value to suppress magnetic perturbation without introducing extraneous signals. The corresponding susceptibility matched materials are obtained by mixing resins of different susceptibility.

U.S. Pat. No. 5,831,434 discloses a sample tube for the use in a nuclear magnetic apparatus comprising a sample tube, said sample tube being formed of a glass substance, wherein the magnetic susceptibility of said glass substance has been adjusted by incorporating therein a sufficient amount of one or more paramagnetic and/or diamagnetic substances so as to impart to said sample tube a magnetic susceptibility proximate to that of a liquid sample to be tested.

US-A-2009160439 discloses a method of performing high throughput magnetic sensing of one or more samples. The method comprises selecting a first sample having a first bulk magnetic susceptibility, selecting an assay plate having a second bulk magnetic susceptibility matched to the first bulk magnetic susceptibility, the assay plate including multiple wells, introducing the first sample into a plurality of the wells, and performing magnetic sensing on the plurality of wells containing the first sample. Assay plates, caps, kits, and other devices and methods relating to high throughput magnetic sensing are also disclosed. The document apart from disclosing specific polyetherimide well plates fails to disclose further specific systems which can be adapted in magnetic susceptibility and only discloses large lists of possible materials.

US-A-2005024055 discloses a nuclear magnetic resonance (NMR) sample tube which is made of a polymeric material instead of glass. Such tubes are thinner than glass tubes, thus increasing the internal volume and sample size. Such tubes are also allegedly more closely matched to the magnetic susceptibility of specific solvents. Such tubes have greater mechanical stability, thus leading to less tube breakage during NMR processing. Such tubes also lend themselves to various concentric tubal arrangements which permit separation and mixing of samples to minimize subtraction artifacts in interacting systems. The document only discloses sample tubes consisting of a single polymeric material.

US-A-2008106263 discloses a sample vessel made of material with first magnetic susceptibility, for containing a sample substance with magnetic susceptibility not equal to said first susceptibility to be analyzed in a nuclear magnetic resonance (NMR) spectrometer, has an inner interface toward the sample substance and an outer interface toward the environment that exhibits a further magnetic susceptibility. The shape of the interface toward the sample substance and the interface toward the environment are coordinated to match the discontinuities in susceptibility at the interfaces in such a way that on introduction of the sample tube filled with sample substance into the previously homogeneous magnetic field of an NMR spectrometer, the magnetic field inside the sample substance remains largely homogeneous.

U.S. Pat. No. 3,091,732 relates in general to a gyromagnetic resonance method and apparatus and more specifically to a novel method and apparatus for improving the magnetic field homogeneity over a sample volume whereby extremely high resolution of the gyromagnetic resonance spectra is obtainable. It is claimed to be useful, for example, in high resolution gyromagnetic resonance spectroscopy, in process control, and for precise measurement of magnetic fields. More specifically, it describes a gyromagnetic resonance apparatus including; a probe with a cavity for containing a sample and for immersing the sample ensemble in a polarizing magnetic field; said probe means including a plurality of elements for exciting and detecting gyromagnetic resonance of the gyromagnetic bodies contained within said probe means, there being a region of space within said probe occupied by first, second and third materials of dissimilar magnetic susceptibility, said second and third materials forming a structural portion of said probe, and said second and third materials of said two material probe structural portions being made up of a properly proportioned amount of paramagnetic and diamagnetic material to match the magnetic susceptibility of said two material structural portion to the magnetic susceptibility of said first material, whereby said three material composite probe region of space is caused to have a substantially uniform magnetic susceptibility as seen from the sample ensemble of gyromagnetic bodies disposed within the probe cavity to prevent undesired magnetic field gradients within the sample.

US-A-2009295389 describes a m magnetic field probe with a sample that exhibits magnetic resonance at an operating frequency, an electrically conductive structure surrounding the sample for receiving a magnetic resonance signal therefrom, and a solid jacket encasing the sample and the conductive structure. The jacket is made of a hardened two-component epoxy system containing a paramagnetic dopant dissolved therein, with the concentration of the dopant being chosen such that the jacket has a magnetic susceptibility that is substantially identical to the magnetic susceptibility of the conductive structure.

U.S. Pat. No. 5,831,434 relates to a device for the use in a nuclear magnetic apparatus comprising a sample tube, said sample tube being formed of a glass substance, wherein the magnetic susceptibility of said glass substance has been adjusted by incorporating therein a sufficient amount of one or more paramagnetic and/or diamagnetic substances so as to impart to said sample tube a magnetic susceptibility proximate to that of a liquid sample to be tested.

WO-A-2014138136 relates to methods and devices for NMR spectroscopy analyzing sealed containers e.g., food and beverage containers and other containers, and particularly according to specific embodiments sealed containers made of a conducting but generally non-ferromagnetic metal or other conducting material. Many strategies for contaminant detection require a container to be violated, a process that can destroy the container or product and is impractical in large scale applications. The disclosed invention overcomes these and other problems by providing methods and devices for the detection of contaminants and/or contraband in metal or conducting containers by NMR spectroscopy.

SUMMARY OF THE INVENTION

It is an object of the present invention to propose a new material which can be used in nuclear magnetic resonance applications, in particular for high-field applications, going up to more than 5 T, or in the meantime even up to more than 27 T with improved suitability as concerns handling of samples, and in particular with a view to changing samples without having to adapt the settings of the corresponding device or reducing the need of such adaptation.

The general idea behind this invention is to find and make available a material which is mimicking to a maximum extent the magnetic volume susceptibility of the sample to be analysed, and avoids to have spatial changes of magnetic volume susceptibility within the relevant volume for detection and/or irradiation. In particular this shall be proposed for liquid samples with a view to reducing sample volume and corresponding allowing increasing concentration and signal-to-noise for a given amount of sample, and to avoid having to shim for each sample in as far as possible. Also, the proposed material shall be easy to handle, as concerns manufacturing but also as concerns mounting/filling of the sample into the corresponding holder made of the proposed material.

In high resolution NMR, a key design challenge is to keep the magnetic field ($B_0$) distortions in the critical volume of interest as small as possible. As a consequence of this, all materials used in this volume of interest should have a geometric uniformity along z axis or a volume susceptibility matched with the surrounding medium which keeps the distortion as small as possible resulting in linewidths of NMR signals as small as possible for highest signal to noise ratio.

Preferably the magnetic volume susceptibility of the compound is adapted to the magnetic volume susceptibility of the solvent used for dissolving and/or suspending a sample system (e.g. a biological sample molecule). Correspondingly therefore, preferably the magnetic volume susceptibility of the compound is adapted to the magnetic volume susceptibility of the corresponding solvent as given in the list of the following table, wherein the adaptation is typically such that the magnetic volume susceptibility of the compound is within a range of +/−5%, preferably in the range of +/−2%, most preferably in the range of +/−1% or even +/−0.5% of the corresponding absolute value:

|  | Volume Susceptibility $10^{-6}$ (SI) |
| --- | --- |
| H2O (20° C.) | −9.03 |
| Acetone | −5.76 |
| Benzene | −7.76 |
| Ethanol | −7.24 |
| Methanol | −6.63 |
| D2O | −8.86 |

As for the uniform geometry, $B_0$ (in the active volume) is not distorted as long as the geometry of a material is uniform in z direction within the detection active volume, which is typically defined as the volume enclosed by the irradiation/detection coils, plus a margin which is typically 50% of the volume above and below the detection active volume (in z direction).

Often a uniform geometry of design elements is not possible. In this case, the material in the volume of interest needs to be magnetically compensated (or volume susceptibility matched) in relation to the corresponding enclosed medium. E.g. the NMR coil material surrounding the NMR sample needs to be magnetically compensated in relation to the corresponding variable temperature flow gas ($N_2$ or air).

It should be noted that this volume susceptibility matching for optimum conditions is not limited to the above-mentioned detection active volume and the corresponding extension above and below along the Z axis and the corresponding margin, but it may also include areas radially behind and outside of the coils since spatial changes in magnetic volume susceptibility will be influencing the overall radiofrequency field as irradiated/detected by the coils. This defines a detection and magnetic field homogeneity relevant volume which includes not only the sample area but also areas radially outside of the coil, and the proposed materials are suitable and adapted to be used in that detection and magnetic field homogeneity relevant volume and the use is not limited to sample holders made of such a material. Specifically, the proposed material or compound can be used for embedding coils or surrounding coils, or forming part of a corresponding probe head in the vicinity of the coils and the sample area.

In high resolution NMR, susceptibility matched materials have been used for conductors e.g. NMR coils. In the case of insulators/dielectric materials, some efforts were made by to compensate and susceptibility match glass for NMR tubes as pointed out in the above discussion of the prior art. On the other hand, also standard polymers have been used, to get a susceptibility matching which is near to the medium of use.

According to a first aspect of the present invention therefore the use of a compound is proposed consisting of the following components:

(A) 40-99.99, preferably 40-99.95 weight percent of at least one thermoplastic or thermoset polymer material, normally selected as a halogenated or perhalogenated polymer;

(B) 0.01-60, preferably 0.05-60 weight percent of at least one inorganic or metallo-organic particulate diamagnetic or paramagnetic material;

(C) 0-39.99, preferably 0-39.95 weight percent of at least one additive different from (B);

as a construction material in the detection-relevant spatial area of a nuclear magnetic resonance device with a static magnetic field of at least 1 Tesla ((A)-(C) always supplementing to 100% of the total compound).

This compound allows to use a polymer material as component (A) avoiding brittle glass and associated rather large wall thicknesses and simplifying production processes and repair processes, and to very finely tune the magnetic volume susceptibility of the final compound by adding the corresponding appropriate and required amount of component (B).

Up to now, no insulating volume susceptibility matched material is available which can be used as a construction material for designing elements within the volume of interest. The preferred requirements as made available by the presently proposed compound alone or, in particular according to preferred embodiments, in combination, are the following:

Susceptibility matched

Machinable/mouldable

Mechanically stable

No $^1$H background

Dielectric, low rf losses

Unbreakable

Low weight

Cost effective

Temperature stable

NMR solvent stable

The following invention generally describes volume susceptibility materials with such ideal properties.

The proposed compound comprises or consists of a mixture of a suitable polymer as component (A) and a suitable dielectric as component (B):

The polymer of component (A) is selected as a halogenated or perhalogenated polymer, and can for example be PFA, PTFE or the like, preferably this is a polymer essentially or completely free from 1H.

For manufacturing reasons it is possible that even perhalogenated polymers comprise residues of $^1$H. It is preferred to use perhalogenated polymers having a little residual $^1$H, preferably the perhalogenated polymers should have less than 1 mole-% of $^1$H relative to the total of halogen atom content in the compound, preferably less than 50 or less than 1 ppm and even more preferably less than 50 or less than 1 ppb.

The dielectric, also depending on the solvent can be chosen to be a paramagnetic (or diamagnetic) dielectric material, which can e.g. be organic or metallo-organic, and it can be a ceramic material. For water compensation $CeO_2$ or $Cr_2O_3$ can preferably be used either alone or in combination.

Depending on the final product, the compound can be produced by mixing powders of polymer and ceramic paramagnetic and/or diamagnetic material, then hot pressed (sintered) in blocks and afterwards machined (low volume applications) or mixed in an extruder and injection moulded in a corresponding tool (high volume applications). It is also possible to mix a thermoplastic pellet or molten material of compound (A) with a powder of component (B) and to melt mix and/or extrude the resulting material, if needed supplemented by component (C).

A suitable and adapted polymer for sintering is for example PTFE.

A suitable and adapted polymer for injection moulding as for example PFA.

More generally speaking, according to a first preferred embodiment, the polymer material of component (A) is selected as a halogenated or perhalogenated polymer, particularly preferred are polymers which are free from 1H and which further preferably have low dielectric losses, preferably polymer materials which have a dielectric loss (tan δ) at 100 Hz of at most 0.002 or at most 0.001, and/or at 3 GHz of at most 0.002 or at most 0.001 or at most 0.0005.

Preferably component (A) and/or the whole compound has a melting point and/or decomposition point of at least 100° C., preferably at least 200° C. or at least 300° C.

Particularly preferably, component (A) is selected from the group consisting of (per)fluoropolymers, (per)chloropolymers, or (per)fluororchloropolymers.

Possible are for example systems selected from the group consisting of: polyvinylfluoride (PVF), polyvinylidene fluoride (PVDF), polytetrafluoroethylene (PTFE), polychlorotrifluoroethylene (PCTFE) (Kel-F), perfluoroalkoxy polymer (PFA), fluorinated ethylene-propylene (FEP), polyethylenetetrafluoroethylene (ETFE), polyethylenechlorotrifluoroethylene (ECTFE), perfluorinated elastomer (FFKM, FKM), chlorotrifluoroethylenevinylidene fluoride, fluoroelastomer [tetrafluoroethylene-propylene] (FEPM) or fully or partly chlorinated analogues or blends thereof.

Preferably component (A) is a thermoplastic polymer or a polymer which can be hardened by sintering.

To avoid crosstalk with the detection and/or irradiation, it may further be preferred if the compound and in particular component (A) is free or essentially free from $^1$H hydrogen.

To avoid crosstalk with the detection and/or irradiation, it may also be preferred if the compound and in particular component (A) is fully or essentially fully deuterated.

The proposed use may further be characterized in that the inorganic or metallo-organic particulate diamagnetic or paramagnetic material is a metal salt (which term here is to expressly include metal oxides), preferably a transition metal salt (which term here is to expressly include transition metal oxides).

According to yet another preferred embodiment, the inorganic or metallo-organic particulate paramagnetic material is a metal, in particular a transition metal oxide, more preferably selected from the group consisting of cerium oxide, in particular selected as, chromium oxide ($Cr_2O_3$), $ZrO_2$, $TiO_2$, $Y_2O_3$ or $CeO_2$ or a mixture or combined salt thereof. Preferred is an inorganic or metallo-organic particulate paramagnetic material selected from the group consisting of chromium oxide ($Cr_2O_3$), $CeO_2$, or a combination thereof.

Typically as starting material the inorganic or metallic-organic particulate material has a particle size in the range of 0.1-100 Micron, preferably in the range of 1-30 Micron. Preferably the inorganic or metallic-organic particulate material in the material is homogenously and finely dispersed and is not showing agglomerates or aggregation, such that in the final compound still the distributed individual separated particle size is in the range of 0.1-100 Micron, preferably in the range of 1-30 Micron.

The proportion of component (B) is preferably in the range of 0.05-40 weight percent or 0.01-20 weight percent or 0.07-10 weight percent, e.g. 0.14% by weight for $Cr_2O_3$ and e.g. 15% for $ZrO_2$, $TiO_2$, $Y_2O_3$, or $CeO_2$ (weight percent always calculated wrt to the total compound).

The proposed use is further preferably characterised in that the magnetic volume susceptibility of the compound is adapted by a corresponding proportion of component (B) to match the magnetic volume susceptibility of water at room temperature.

The proportion of component (C) it is typically in the range of 0-5 weight percent, preferably in the range of 0.1-2 weight percent, and wherein further preferably component (C) compound is free or essentially free from 1H hydrogen.

According to another aspect of the present invention, it relates to a compound consisting of the following components:

(A) 40-99.9, preferably 40-99.95 weight percent of at least one thermoplastic or thermoset polymer material, normally selected as a halogenated or perhalogenated polymer;

(B) 0.01-60, preferably 0.05-60 weight percent of at least one inorganic particulate diamagnetic or paramagnetic material;

(C) 0-39.99, preferably 0-39.95 weight percent of at least one additive different from (B);

in particular for use as a construction material in the detection-relevant spatial area of a nuclear magnetic resonance device with a static magnetic field of at least 1 Tesla ((A)-(C) always supplementing to 100% of the total compound).

According to yet another aspect of the present invention, it relates to a construction element and/or isolation element for use in the detection-relevant spatial area of a nuclear magnetic resonance device with a static magnetic field of at least 1 Tesla comprising or consisting of a compound as defined above.

According to another aspect of the present invention it relates to a nuclear magnetic resonance sample holder comprising or consisting of, at least in the detection relevant spatial area, of a compound as detailed above.

In high resolution NMR, the standard sample container is a glass tube, e.g. 5 mm outer diameter and 4.2 mm inner diameter, length 180 mm, one side open. This sample container is typically filled with a liquid with a height of 40 mm (540 µl sample volume). The NMR active volume is typically only 20 mm. The liquid column of 10 mm above and below the active volume is a susceptibility matched buffer where the B1 strength of the NMR coil is reduced to a neglectable value. Without this susceptibility matched buffer, the $B_0$ distortion in the active volume would be disastrous high for high resolution NMR.

There are several disadvantages of this kind of volume susceptibility matched buffering: E.g. up to 100% more sample volume is needed. In the case of proteins, it gets extremely expensive and time consuming to grow this overhead on proteins.

$B_1$ degrades not immediately (digitally) to zero. The NMR coil unfortunately detects also signal from the susceptibility matched buffer volume where the $B_0$ homogeneity is already strongly degraded (resulting e.g. in insufficient water suppression).

The proposed volume susceptibility matched material allows to design NMR containers with the following advantages:

Much shorter

No buffer volume, only the active volume is needed.

Unbreakable

Low weight

Cost effective

Easy to transport in sample exchangers

Ultra low rf losses

Well defined volume

According to a first preferred embodiment of such a nuclear magnetic resonance sample holder it takes the form of a container for a liquid sample comprising a substance to be analysed in dissolved and/or suspended form, wherein the magnetic volume susceptibility of said compound is matched to one of the solvent of the liquid sample.

Preferably, the sample holder comprises a cavity for the liquid sample, the volume of which is restricted to the detection area of the nuclear magnetic resonance device for which the sample holder is suitable and adapted, while further portions of the sample holder are made of bulk of said compound with the exception of at least one of inlet means, closure means, volume compensation means, sealing/retaining means.

According to another preferred embodiment of such a nuclear magnetic resonance sample holder it comprises a cavity for the liquid sample, the volume of which cavity is restricted to the detection area of the nuclear magnetic resonance device for which the sample holder is suitable and adapted. In this case the cavity is confined radially by a preferably circular cylindrical (preferably conventional, can be a tube open on both ends or a glass sample holder having a closed bottom) glass sample tube, and bordered on at least one axial side, preferably on both axial sides, by at least one preferably circular cylindrical plug of said compound. The plug or the plugs are inserted into said glass sample tube, in a way such that at the interface between the liquid sample and the at least one plug the liquid sample and the plug material are directly adjacent to each other. Preferably the outer diameter of said at least one plug essentially corresponds to the inner diameter of said glass sample tube such that no liquid from the sample can penetrate between the glass wall and the plug and/or such that there is no airgap adding to the differences of magnetic susceptibility.

The final product can thus be a container with a corresponding plug which can also be formed as a cap.

The cap can be designed with a small hole to fill in the sample liquids with e.g. a syringe, in a way that all air bubbles are removed.

A septum can be used to prevent that liquid is lost during sample transportation.

The diameter of the hole should be below a critical value. Signal stemming from solvent in this area should be neglectable.

For water as a solvent, e.g. PTFE mixed with 0.14 weight percent $Cr_2O_3$ can result in a water volume susceptibility matched material.

To optimize the mechanical properties of PTFE, a higher filling content with ceramic powder is recommended e.g. 15 weight percent $CeO_2$ in PTFE.

Further preferably, the sample holder comprises a lower solid material portion, an adjacent sample cavity portion and an upper solid material portion, wherein said upper solid material portion preferably comprises a plug and/or essentially made of said compound.

According to yet another aspect of the present invention, it relates to a use of a nuclear magnetic resonance sample holder in particular as detailed above for measuring a liquid sample using nuclear magnetic resonance, wherein the magnetic volume susceptibility of the compound of the sample holder is adapted to the liquid of the sample, and wherein preferably the magnetic volume susceptibility is adapted to the magnetic volume susceptibility of water.

Last but not least the present invention relates to a method of manufacturing a nuclear magnetic resonance sample holder (8) in particular as outlined above, wherein a compound consisting of the following components:

(A) 40-99.99, preferably 40-99.95 weight percent of at least one thermoplastic or thermoset polymer material, normally selected as a halogenated or perhalogenated polymer;

(B) 0.01-60, preferably 0.05-60 weight percent of at least one inorganic particulate diamagnetic or paramagnetic material;

(C) 0-39.99, preferably 0-39.95 weight percent of at least one additive different from (B);

is used to form the sample holder, preferably in a machining and/or sintering and/or injection moulding process, and wherein the proportion of component (B) is adapted so that the magnetic volume susceptibility of the sample holder matches with the magnetic volume susceptibility of the sample to be held, in particular the liquid sample to be held, preferably matches the magnetic volume susceptibility of water.

Further embodiments of the invention are laid down in the dependent claims.

BRIEF DESCRIPTION OF THE DRAWINGS

Preferred embodiments of the invention are described in the following with reference to the drawings, which are for the purpose of illustrating the present preferred embodiments of the invention and not for the purpose of limiting the same. In the drawings.

FIG. 3 schematic axial cut through a susceptibility matched container for high-resolution nuclear magnetic resonance measurements according to a first embodiment;

FIGS. 4a)-4b) schematic axial cuts through susceptibility matched containers for high-resolution nuclear magnetic resonance measurements according to a first embodiment (a) and according to a second embodiment including further sealing/retaining elements and an expansion compensation volume.

DESCRIPTION OF PREFERRED EMBODIMENTS

Figure 1:
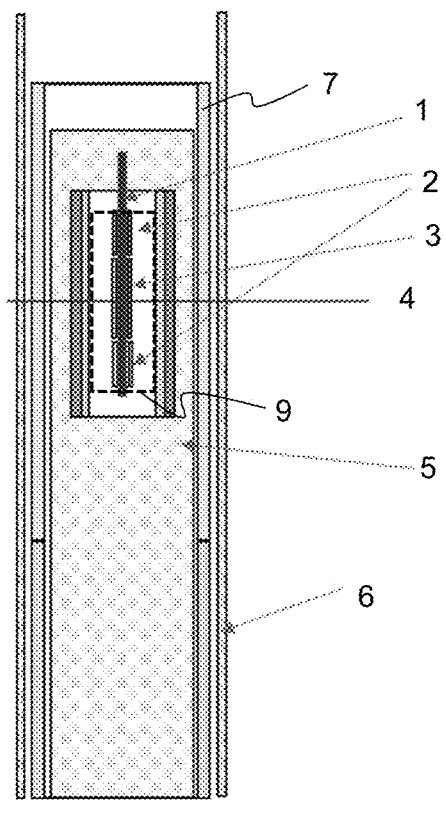
FIG. 1 shows a conventional high-resolution nuclear magnetic resonance measurement setup in a cylindrical high magnetic field magnet in an axial cut.

FIG. 1 shows an axial cut through a typical high resolution NMR setup. The NMR sample 1 in the form of a cylindrical glass tube containing the liquid sample is held in the actual NMR probe head 5. In the probe head 5 the actual NMR irradiation/detection coils 3 are mounted and typically surrounded above and below by radio-frequency shields 2. Further in the probe head and/or in an NMR probe head mounting 7 or in an interior part of the actual magnet, so beyond the actual warm magnet bore 6, there can be additional coils et cetera for the shim.

The direction of the magnetic field 10 is along a vertical axis in the setup, and the magnetic centre in an axial direction is indicated by the horizontal line 4. This line is typically in the vertical centre of the corresponding coil arrangement 3. The coils 3 define a volume of interest 9, this volume of interest includes the detection volume but also goes further above and further below and even extends radially outside of the actual coils, and this is the magnetic field homogeneity relevant volume because it is covered by the radio-frequency field of the coils. It is this volume of interest 9, where magnetic homogeneity is of utmost importance to achieve high signal-to-noise ratios and to avoid distortions. This volume of interest 9 is where the proposed compound is of particular use, because its magnetic volume susceptibility is adapted to the magnetic volume susceptibility of the actual sample, which in effect means that the change in magnetic volume susceptibility felled by the coils in irradiation and/or detection is homogeneous to a maximum extent and is not influenced by magnetic volume susceptibility changes in a spatial dimension. This volume of interest is typically extending along the B field direction 50% above and below in length of the actual detection active volume 12, which is normally defined by the axial height of the saddle or solenoid coils 3.

Figure 2:
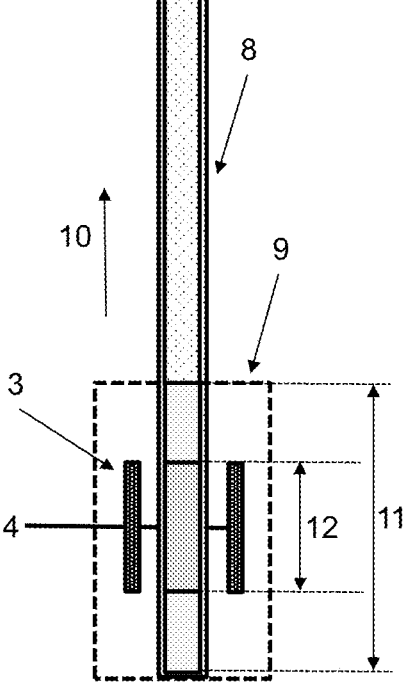
FIG. 2 shows a detailed axial cut through the measurement area of the high-resolution nuclear magnetic resonance measurement setup for liquid state NMR measurements.

This is further illustrated in FIG. 2, where the volume of interest 9, is shown in relation with the detection active volume height 12, the actual detection active volume is the space enclosed by the coils 3 along this height 12. The liquid column typically has a height which is 50% above and below the active volume height 12, and this essentially defines the height of the volume of interest 9. In a radial direction typically the volume of interest, which is defined by a circular cylinder in case of saddle coils, extends 50% beyond the diameter of the coils on each radial side.

The compound as proposed in this application can be used in this volume of interest 9 essentially without disturbing the magnetic volume susceptibility conditions as defined by the magnetic volume susceptibility of the actual sample.

The proposed compound in the form of a $PTFE/Cr_2O_3$ compound can for example be obtained as follows:

Weigh 10 kg PTFE (99% purity, grain size 10-30 um (d50))+14 gr $Cr_2O_3$ (99.9% purity, grain size 1-20 um (d50)) into a drum; cool down to $-15°$ C. for at least 24 hours; pre-mix and re-mix with mixing aggregate; pour the mixture into an appropriate mould; press with 300 $kg/cm^2$, holding time 3 minutes, slowly reduce pressure; demould, then degas for at least 12 hours; sintering at max. 365° C.

The resulting material can be machined to any kind of desired shape using standard machining technology. In particular it is possible to machine the required elements for sample holder as will be discussed further below.

The resulting material has a magnetic volume susceptibility of $-9.03*10^{-6}$ (SI), which is matched to the magnetic susceptibility of a typical sample of water which is in the same range.

FIG. 3 schematically illustrates an NMR tube which is made from such a compound. The NMR tube, in contrast to a conventional glass tube where the cavity extends to the very bottom, in this case in the lower portion 20 is solid in the compound, so does not comprise a cavity for the actual sample. The cavity for the actual sample is restricted to the cavity portion 21, which is then covered by a plug made of the same compound. While such a setup would lead to inacceptable steps in the magnetic volume susceptibility at the interface between the lower portion to the cavity 21, and at the interface between the cavity 21 to the plug 13, leading to loss in signal-to-noise and sensitivity, due to the magnetic volume susceptibility matching of the proposed compound material no such steps are present and the signal-to-noise ratio and the sensitivity can be maintained in spite of having a much smaller sample volume allowing for higher concentration or smaller volume of the actual substance to be analysed for a given amount of available actual substance.

FIGS. 4a)-4b) illustrate two different embodiments of such a sample holder. In a) an embodiment is shown, where, in contrast to FIG. 3, there is no simple cylindrical plug 13, but there is a shaped cap 17, only the lowermost portion of which penetrates into the upper part of the cavity 12 for sealing. This cap 17 can be fixedly attached to the lower portion of the sample holder, or it can be removable to allow filling and emptying of the container. Also it is possible to make such a device in one piece, for example if additive manufacturing is used.

If the cap 17 is fixedly attached to the lower portion of the container, it is useful to have a narrow filling/emptying channel 16, which should have a diameter small enough to avoid any interference of that liquid portion with the measurement. On top the corresponding device can be closed by a septum 15.

FIG. 4b) illustrates another embodiment where the cap 17 is further sealed by corresponding sealing elements 19, for example O-rings, to the lower portion of the container. In addition to that, above the channel 16 a small volume 18, largely outside of the detection space of the coils, can be provided to compensate for temperature and/or pressure induced volume changes of the sample.

LIST OF REFERENCE SIGNS

1 NMR sample
2 radiofrequency shields
3 NMR irradiation/detection coil
4 magnetic centre in axial direction
5 NMR probe head
6 warm magnet bore
7 NMR probe head mounting
8 NMR tube
9 volume of interest, detection and magnetic field homogeneity relevant volume
10 direction of magnetic field, Z direction, $B_0$
11 liquid column in 8, typically 40 mm axial length
12 detection active volume height, typically 20 mm axial length
13 plug of magnetic volume susceptibility matched material
14 container of magnetic volume susceptibility matched material
15 septum
16 filling/emptying channel
17 cap
18 thermal expansion compensation volume
19 sealing/retaining element
20 lower solid material portion
21 cavity portion
22 upper solid material portion

The invention claimed is:

1. A method of using a compound consisting of the following components:
(A) 40-99.99 weight percent of at least one thermoplastic or thermoset polymer material selected as a halogenated or perhalogenated polymer;
(B) 0.01-60 weight percent of at least one inorganic or metallo-organic particulate diamagnetic or paramagnetic material; and
(C) 0-39.99 weight percent of at least one additive different from (B);
by constructing a nuclear magnetic resonance sample holder or a part thereof comprising the compound at least in a detection-relevant spatial area of a nuclear magnetic resonance device with a static magnetic field of at least 1 Tesla.

2. The method according to claim 1, wherein the polymer material of component is selected as a halogenated or perhalogenated polymer, with at least one of a melting point and decomposition point of at least 100° C.,
and/or wherein the component (A) is a thermoplastic polymer.

3. The method according to claim 1, wherein the component (A) and/or the component (B) and/or the component (C) or the whole compound is free or essentially free from $^1$H hydrogen,
and/or wherein the compound is fully or essentially fully deuterated.

4. The method according to claim 1, wherein the inorganic or metallo-organic particulate diamagnetic or paramagnetic material is a metal salt including metal oxides.

5. The method according to claim 1, wherein the proportion of component (B) is in the range of 0.05-20 weight percent.

6. The method according to claim 1, wherein the magnetic volume susceptibility of the compound (B) is adapted by a corresponding proportion of component to match the magnetic volume susceptibility of the sample solvent.

7. The method according to claim 1, wherein the proportion of component (C) is in the range of 0-5 weight percent.

8. The method according to claim 1, wherein the polymer material of component (A) is selected as a halogenated or perhalogenated polymer, with at least one of a melting point and decomposition point of at least 200° C. or at least 300° C.

9. The method according to claim 1, wherein the polymer material of component (A) is selected as a polymer free from 1H and/or with low dielectric losses, including selected from the group consisting of (per) fluoropolymers, (per)chloropolymers, or (per)fluororchloropolymers.

10. The method according to claim 1, wherein the polymer material of component (A) is selected from the group consisting of: polyvinylfluoride, polyvinylidene fluoride, polytetrafluoroethylene, polychlorotrifluoroethylene, perfluoroalkoxy polymer, fluorinated ethylene-propylene, polyethylenetetrafluoroethylene, polyethylenechlorotrifluoroethylene, perfluorinated elastomer, fluorocarbon [chlorotrifluoroethylenevinylidene fluoride], fluoroelastomer [tetrafluoroethylene-Propylene], or chlorinated analogues or blends thereof.

11. The method according to claim 1, wherein the paramagnetic material is a transition metal salt including transition metal oxides,
or wherein the inorganic or metallo-organic particulate paramagnetic material is selected from the group consisting of: cerium oxide, including selected as chromium oxide, $ZrO_2$, $TiO_2$, $Y_2O_3$, paramagnetic manganese oxide, including selected from MnO, $MnO_2$, $Mn_3O_4$ or $CeO_2$, or a mixture or combined salt thereof.

12. The method according to claim 1, wherein the inorganic or metallo-organic particulate paramagnetic material is selected from the group consisting of: chromium oxide, $CeO_2$, or a combination thereof.

13. The method according to claim 1, wherein a proportion of component (B) is in the range of 0.1-2 or 0.1-1 weight percent, or in the range of 0.1-0.3 weight percent.

14. The method according to claim 1, wherein the magnetic volume susceptibility of the compound is adapted by a corresponding proportion of component (B) to match the magnetic volume susceptibility of water at room temperature.

15. The method according to claim 1, wherein the proportion of component (C) is in the range of 0.1-2 weight percent, and wherein component compound is free or essentially free from 1H.

16. A compound consisting of the following components:

(A) 40-99.99 weight percent of at least one thermoplastic or thermoset polymer material selected as a halogenated or perhalogenated polymer;

(B) 0.01-60 weight percent of at least one inorganic particulate diamagnetic or paramagnetic material;

(C) 0-39.99 weight percent of at least one additive different from (B);

for use as a construction material in the detection-relevant spatial area of a nuclear magnetic resonance device with a static magnetic field of at least 1 Tesla.

17. A construction element and/or isolation element for use in the detection-relevant spatial area of a nuclear magnetic resonance device with a static magnetic field of at least 1 Tesla comprising or consisting of a compound according to claim 16.

18. The construction element according to claim 17 in the form of a nuclear magnetic resonance sample holder comprising or consisting of, at least in the detection relevant spatial area, said compound.

19. A nuclear magnetic resonance sample holder according to claim 18 in the form of a container for a liquid sample comprising a substance to be analysed in dissolved and/or suspended form, wherein the magnetic volume susceptibility of said compound is matched to one of the solvent of the liquid sample.

20. The nuclear magnetic resonance sample holder according to claim 19, comprising a cavity for the liquid sample, the volume of which is restricted to the detection area of the nuclear magnetic resonance device for which the sample holder is suitable and adapted, while further portions of the sample holder are made of bulk of said compound with the exception of at least one of inlet means, closure means, volume compensation means, sealing/retaining means or comprising a cavity for the liquid sample, the volume of which cavity is restricted to the detection area of the nuclear magnetic resonance device for which the sample holder is suitable and adapted, and which cavity is confined radially by a cylindrical glass sample tube, and bordered on at least one axial side, by at least one plug of said compound, inserted into said glass sample tube, wherein at the interface between the liquid sample and the at least one plug the liquid sample and the plug material are directly adjacent to each other.

21. The nuclear magnetic resonance sample holder according to claim 19, comprising a lower solid material portion, an adjacent sample cavity portion and an upper solid material portion.

22. A method of using a nuclear magnetic resonance sample holder according to claim 19 for measuring a liquid sample using nuclear magnetic resonance, by filling the nuclear magnetic resonance sample holder with said liquid sample and measuring the sample using nuclear magnetic resonance, wherein the magnetic volume susceptibility of the compound of the sample holder is adapted to one of the liquid of the sample.

23. The method according to claim 22, wherein the magnetic volume susceptibility is adapted to the magnetic volume susceptibility of the NMR solvent, selected from at least one of water, acetone, methanol, chloroform, in deuterated or undeuterated form.

24. A method of manufacturing a nuclear magnetic resonance sample holder according to claim 19, wherein a compound consisting of the following components:

(A) 40-99.99 weight percent of at least one thermoplastic or thermoset polymer material selected as a halogenated or perhalogenated polymer;

(B) 0.01-60 weight percent of at least one inorganic particulate diamagnetic or paramagnetic material;

(C) 0-39.99 weight percent of at least one additive different from (B);

is taken and a nuclear magnetic resonance sample holder or a part thereof is constructed therefrom to form the sample holder or a part thereof.

25. The method according to claim 24, wherein the compound is used to form the sample holder, in a machining, after powder mixing of (A)-(C) until a homogenous powder mixture is obtained and subsequent sintering at elevated temperature of at least at least 200° C. or at least 300° C., at elevated pressure, including of at least 100 kg/cm$^2$, at least 200 kg, or at least 250 kg/cm$^2$, and/or in an injection moulding process, and wherein the proportion of component (B) is adapted so that the magnetic volume susceptibility of the sample holder matches with the magnetic volume susceptibility of the sample to be held.

26. The nuclear magnetic resonance sample holder according to claim 19, comprising a cavity for the liquid sample, the volume of which cavity is restricted to the detection area of the nuclear magnetic resonance device for which the sample holder is suitable and adapted, and which cavity is confined radially by a circular cylindrical glass sample tube, and bordered on both axial sides, by at least one circular cylindrical plug of said compound, inserted into said glass sample tube, wherein at the interface between the liquid sample and the at least one plug the liquid sample and the plug material are directly adjacent to each other, and wherein the outer diameter of said at least one plug essentially corresponds to the inner diameter of said glass sample tube.

27. The nuclear magnetic resonance sample holder according to claim 19, comprising a lower solid material portion, an adjacent sample cavity portion and an upper solid material portion, wherein said upper solid material portion comprises a plug essentially made of said compound.

* * * * *